(12) United States Patent
Garcia et al.

(10) Patent No.: US 8,296,630 B2
(45) Date of Patent: Oct. 23, 2012

(54) MULTI-MODE FORWARD ERROR CORRECTION

(75) Inventors: Arturo Garcia, Tappan, NY (US); Mark Capellaro, Danbury, CT (US); Steven R. Paul, Township of Washington, NJ (US)

(73) Assignee: Fujitsu Limited, Kawasaki-shi (JP)

( * ) Notice: Subject to any disclaimer, the term of this patent is extended or adjusted under 35 U.S.C. 154(b) by 928 days.

(21) Appl. No.: 12/367,595

(22) Filed: Feb. 9, 2009

(65) Prior Publication Data

US 2010/0088577 A1 Apr. 8, 2010

Related U.S. Application Data

(60) Provisional application No. 61/102,046, filed on Oct. 2, 2008.

(51) Int. Cl.
*G06F 11/00* (2006.01)
(52) U.S. Cl. .......................................... 714/776
(58) Field of Classification Search .............. 714/756, 714/762, 776, 784
See application file for complete search history.

(56) References Cited

U.S. PATENT DOCUMENTS

| | | | |
|---|---|---|---|
| 6,622,277 B1 * | 9/2003 | Ramanujam et al. | 714/755 |
| 6,754,749 B1 | 6/2004 | Mounsef et al. | 710/100 |
| 7,146,553 B2 | 12/2006 | Jarchi et al. | 714/755 |
| 7,197,685 B2 * | 3/2007 | Limberg | 714/756 |
| 7,231,575 B2 * | 6/2007 | Kauschke et al. | 714/755 |
| 7,318,187 B2 * | 1/2008 | Vayanos et al. | 714/776 |
| 7,415,658 B2 | 8/2008 | Linkewitsch | 714/779 |
| 2002/0023247 A1 * | 2/2002 | Akiyama et al. | 714/758 |
| 2002/0056064 A1 * | 5/2002 | Kidorf et al. | 714/755 |
| 2003/0188253 A1 * | 10/2003 | Kauschke et al. | 714/782 |
| 2006/0282745 A1 * | 12/2006 | Joseph et al. | 714/758 |
| 2007/0061665 A1 * | 3/2007 | Cranford et al. | 714/752 |
| 2007/0067695 A1 * | 3/2007 | Griesser et al. | 714/755 |

OTHER PUBLICATIONS

Flashwave® 7500 Multifunction ROADM/DWDM Platform. p. 7.*
Cortina Systems IXF30009/30010/30011 Optical Transport Processors, Product Brief, Product Brief No. 302229-2.1, Cortina Systems, Inc., Copyright © 2004-2008, 4 pages, Feb. 6, 2009.

* cited by examiner

*Primary Examiner* — Scott Baderman
*Assistant Examiner* — Elmira Mehrmanesh
(74) *Attorney, Agent, or Firm* — Baker Botts L.L.P.

(57) ABSTRACT

According to one embodiment, a system for multi-mode forward error correction comprises a substrate, forward error correction (FEC) modules, and a controller. The FEC modules are disposed outwardly from the substrate. A first FEC module performs forward error correction according to a first FEC scheme, and a second FEC module performs forward error correction according to a second FEC scheme. The controller configures the first FEC module and the second FEC module to convert from an input FEC scheme to an output FEC scheme for a stream.

18 Claims, 7 Drawing Sheets

MULTI-MODE FORWARD ERROR CORRECTION

RELATED APPLICATION

This application claims benefit under 35 U.S.C. §119(e) of U.S. Provisional Application Ser. No. 61/102,046, entitled "Multi-Mode Forward Error Correction Support for Optical Nodes," filed Oct. 2, 2008.

TECHNICAL FIELD

This invention relates generally to the field of communication systems and more specifically to multi-mode forward error correction.

BACKGROUND

Optical signal noise in optical transport networks can create problems. For example, such noise can limit the maximum span length and/or number of spans of the network. Such noise can also restrict the number of channels in a dense wavelength division multiplexing (DWDM) system and can limit the number of transparent optical network elements between 3R regeneration. Furthermore, optical signal noise requires tight component parameters.

Forward error correction (FEC) can counteract the effects of optical noise. Forward error correction includes Reed Solomon FEC (RSFEC), Enhanced FEC (EFEC) (such as EFEC provided by APPLIED MICRO CIRCUITS CORPORATION), and Ultra FEC (UFEC) (such as UFEC provided by CORTINA SYSTEMS).

SUMMARY OF THE DISCLOSURE

In accordance with the present invention, disadvantages and problems associated with previous techniques for forward error correction may be reduced or eliminated.

According to one embodiment, a system for multi-mode forward error correction comprises a substrate, forward error correction (FEC) modules, and a controller. The FEC modules are disposed outwardly from the substrate. A first FEC module performs forward error correction according to a first FEC scheme, and a second FEC module performs forward error correction according to a second FEC scheme. The controller configures the first FEC module and the second FEC module to convert from an input FEC scheme to an output FEC scheme for a stream.

Certain embodiments of the invention may provide one or more technical advantages. A technical advantage of one embodiment may be that a system includes a first FEC module that performs forward error correction according to a first FEC scheme and a second FEC module that performs forward error correction according to a second FEC scheme. The FEC modules may also perform forward error correction according to a common FEC scheme. The FEC modules may provide multiple FEC schemes as well as conversion among the FEC schemes. Another technical advantage of one embodiment may be that the system may include clocking subsystems that provide clock signals that allow the apparatus to accommodate different types and rates of signals.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF THE DRAWINGS

Embodiments of the present invention and its advantages are best understood by referring to FIGS. 1 through 16 of the drawings, like numerals being used for like and corresponding parts of the various drawings.

Figure 1:
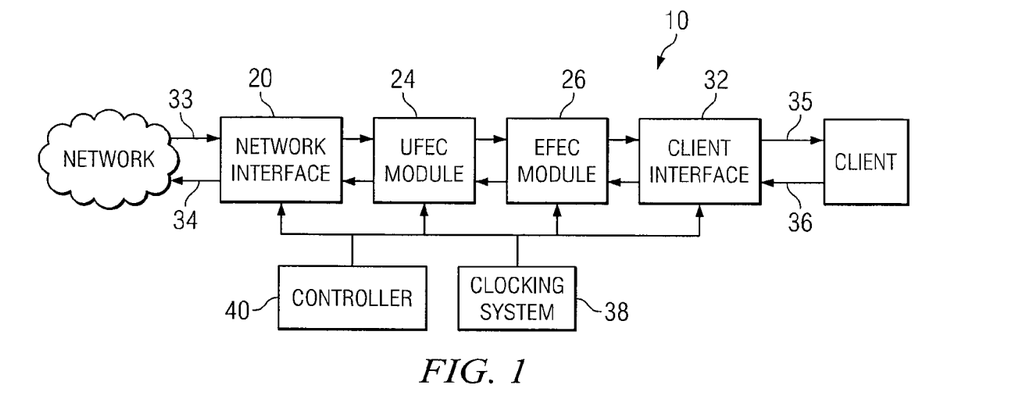
FIG. 1 illustrates one embodiment of a system that provides forward error correction for an optical network.

FIG. 1 illustrates one embodiment of a system 10 that provides forward error correction for a network that communicates information using signals. In certain embodiments, system 10 includes a first FEC module that performs forward error correction according to a first FEC scheme and a second FEC module that performs forward error correction according to a second FEC scheme. The FEC modules may also perform forward error correction according to a common FEC scheme. The FEC modules may provide multiple FEC schemes as well as conversion among the FEC schemes.

In certain embodiments, system 10 includes a network interface 20, a UFEC module 24, an EFEC module 26, a client interface 32, a clocking system 38, and a controller 40 coupled as shown. Network interface 20 interfaces with a receive path 33 and a transmit path 34 coupled to network-side elements. Client interface 32 interfaces with a receive path 36 and a transmit path 35 coupled to client-side devices.

Forward error correction (FEC) modules 24 and 26 perform forward error correction, and may comprise any device suitable to be configured to perform forward error correction, such as application specific standard product (ASSP) integrated circuits (ICs).

In certain embodiments, FEC module 24 may support a first FEC scheme, and FEC module 26 may support a second FEC scheme that is not compatible with the first FEC scheme. Both FEC modules 24 and 26 may support a common FEC scheme.

The first, second, and common FEC schemes may be any suitable FEC schemes. For example, each FEC scheme may be selected from any suitable Reed Solomon FEC (RSFEC), Enhanced FEC (EFEC), and/or Ultra FEC (UFEC) schemes. An example of an EFEC scheme may be the EFEC scheme described by the G.975.1 I.4 standard, and of a UFEC scheme may be the UFEC scheme described by the G.975.1 I.7 standard. In the illustrated embodiment, UFEC module 24 supports UFEC and RSFEC schemes, and EFEC module 26 supports EFEC and RSFEC schemes. Modules 24 and 26, however, may support any suitable FEC schemes.

Clocking system 38 generates clock frequencies and clock traceabilities appropriate for particular input and/or output signals. In certain embodiments, clocking system 38 includes discrete phase lock loops (PLLs) and programmable clock synthesizers.

Controller 40 controls the operations of system 10. In certain embodiments, controller 40 identifies an input FEC scheme of a stream and an output FEC scheme of the stream, and configures FEC modules 24 and 26 perform a conversion from the input FEC scheme to the output FEC scheme. In certain embodiments, controller 40 identifies an input signal type of a stream and an output signal type of the stream, and configures clocking system 38 to perform a conversion from the input signal type to the output signal type.

As an example, controller 40 identifies that an input FEC scheme is the UFEC scheme and that an output FEC scheme is also the UFEC scheme. Controller 40 may then configure UFEC module 24 to perform forward error correction according to the UFEC scheme.

As another example, controller 40 identifies that an input FEC scheme is the EFEC scheme and that an output FEC scheme is also the EFEC scheme. Controller 40 may then configure EFEC module 26 to perform forward error correction according to the EFEC scheme.

As another example, controller 40 identifies that an input FEC scheme is the UFEC scheme and that an output FEC scheme is the EFEC scheme. Controller 40 may then configure UFEC module 24 to perform forward error correction according to the UFEC scheme and EFEC module 26 to perform forward error correction according to the EFEC scheme. The interface between FEC modules 26 and 28 may perform RSFEC or no FEC.

The examples illustrate a transponder type application, but embodiments may be used in any suitable application. For example, embodiments may be used in an application that is connected to a backplane, such as that of a switch fabric. In these embodiments, client interface 32 may be replaced with the backplane or switch fabric.

Controller 40 and other components of system 10 are described in more detail with reference to the following figures. A component of system 10 may include an interface, logic, memory, and/or other suitable elements. An interface receives input, sends output, processes the input and/or output, and/or performs other suitable operation. An interface may comprise hardware and/or software.

Logic performs the operations of the component, for example, executes instructions to generate output from input. Logic may include hardware, software, and/or other logic. Logic may be encoded in one or more tangible media and may perform operations when executed by a computer. Certain logic, such as a processor, may manage the operation of a component. Examples of a processor include one or more microprocessors, one or more applications, and/or other logic.

In particular embodiments, the operations of the embodiments may be performed by one or more computer readable media encoded with a computer program, software, computer executable instructions, and/or instructions capable of being executed by a computer. In particular embodiments, the operations of the embodiments may be performed by one or more computer readable media storing, embodied with, and/or encoded with a computer program and/or having a stored and/or an encoded computer program.

A memory stores information. A memory may comprise one or more tangible, computer-readable, and/or computer-executable storage medium. Examples of memory include computer memory (for example, Random Access Memory (RAM) or Read Only Memory (ROM)), mass storage media (for example, a hard disk), removable storage media (for example, a Compact Disk (CD) or a Digital Video Disk (DVD)), database and/or network storage (for example, a server), and/or other computer-readable medium.

Figures 2, 2A:
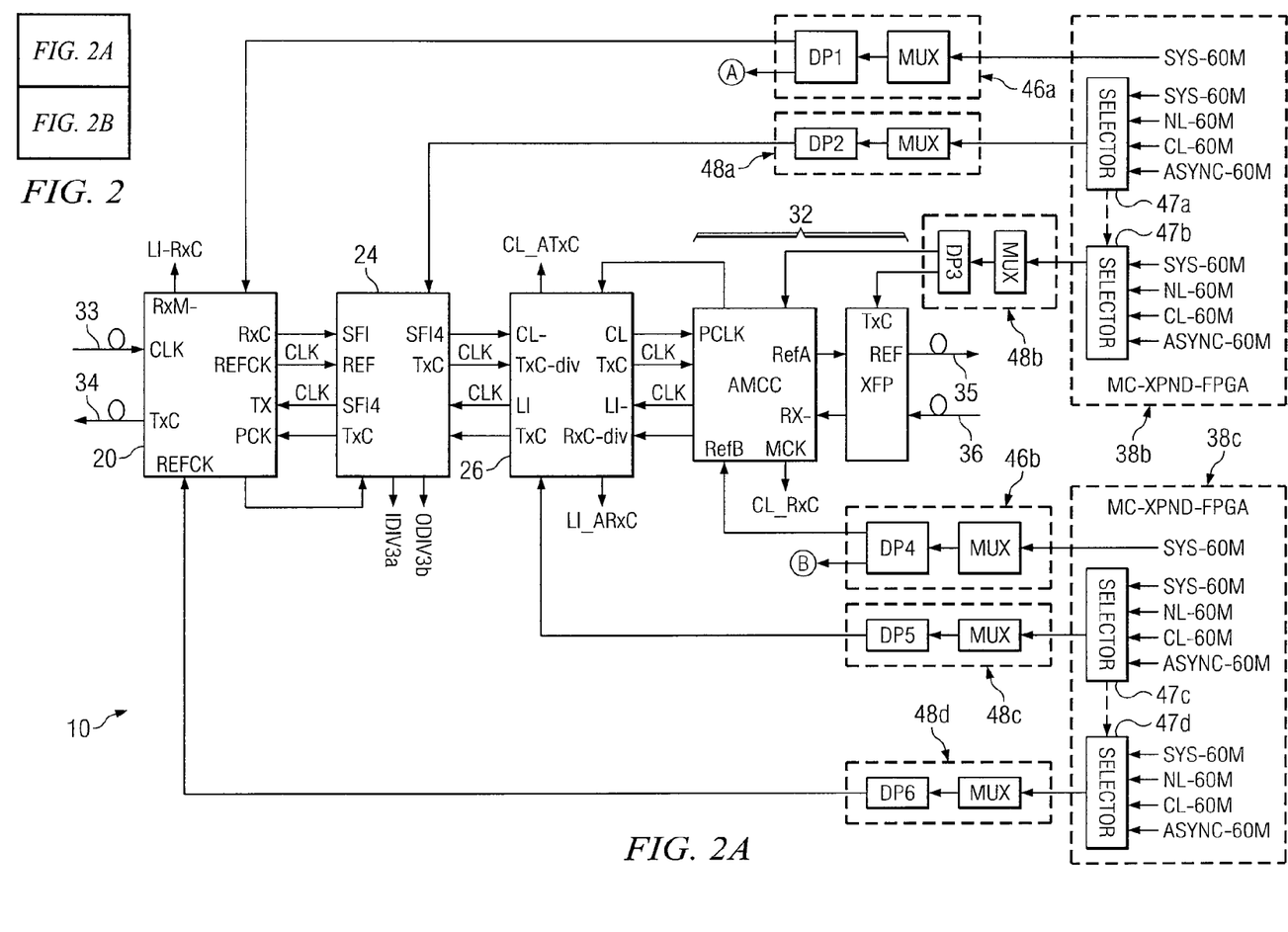
FIG. 2 illustrates an example of the system of FIG. 1.
Figure 2B:
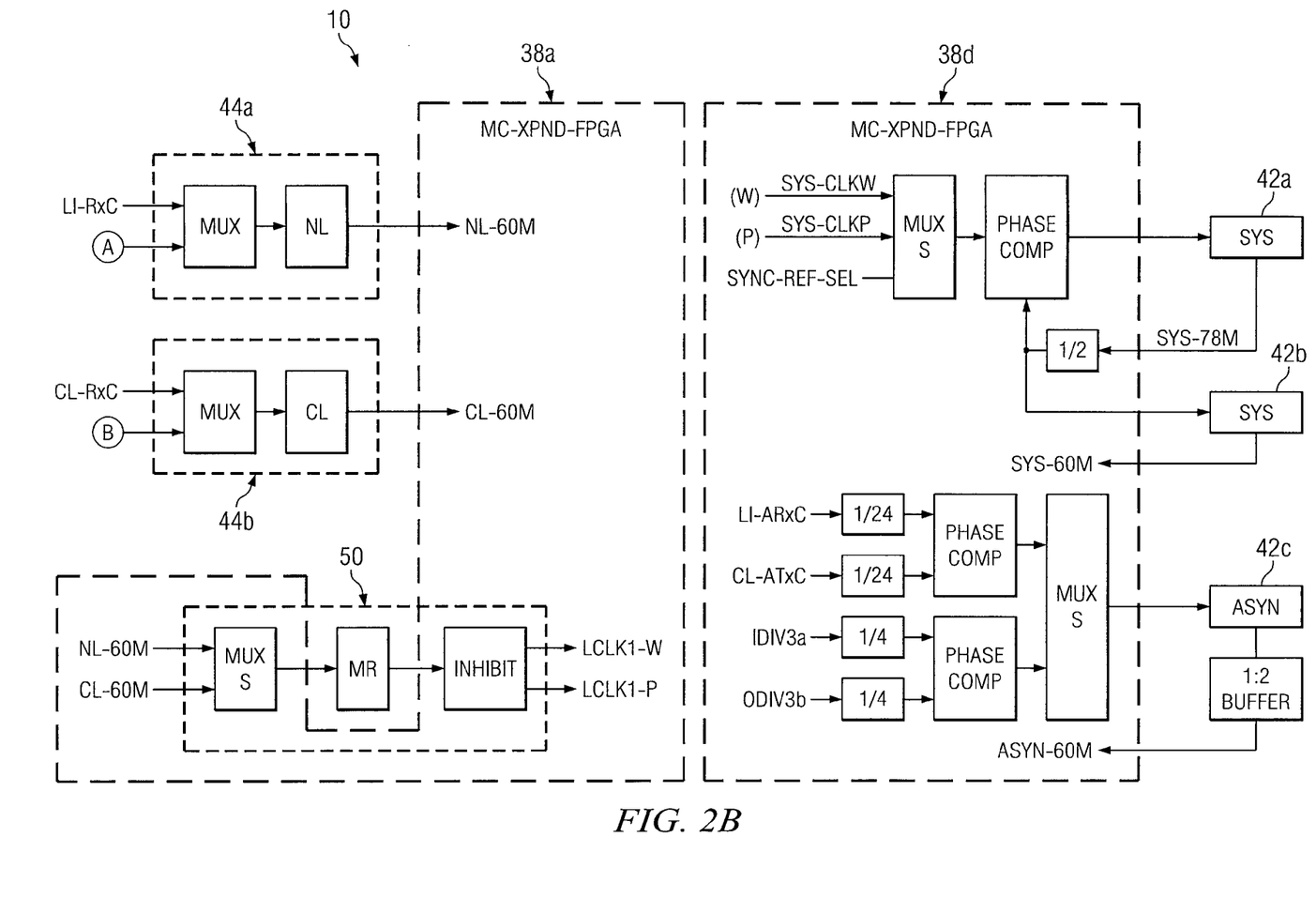

FIG. 2 illustrates an example of system 10 of FIG. 1. In certain embodiments, system 10 includes network interface 20, UFEC module 24, EFEC module 26, client interface 32, and clocking system 38 (38a, and/or 38d) coupled as shown.

In certain embodiments, network interface 20 comprises a variable optical attenuator (VOA), a narrow band optical module (NBO), and/or a Multi-Source Agreement (MSA) transceiver circuit. The variable optical attenuator reduces the incoming signal level to the range of the narrow band optical module. The narrow band optical module performs receive (Rx) clock data recovery (CDR) and transmit and/or receive (Tx/Rx) Serializer/Deserializer (SerDes) operations.

In certain embodiments, client interface 32 comprises a 10 Gigabit (Gbit) small form factor pluggable (XFP) and a transceiver circuit. The small form factor pluggable performs electrical-to-optical and/or optical-to-electrical conversion. The transceiver circuit performs receive (Rx) clock data recovery (CDR) and transmit and/or receive (Tx/Rx) Serializer/Deserializer (SerDes) operations.

UFEC module 24 may comprise any suitable processor, for example, the TENABO IXF30011 Optical Transport Processor. In certain embodiments, UFEC module 24 may be configured as a SONET framer providing section and line termination for Optical Carrier192 (OC192) signals. UFEC module 24 may be operated as a bridge device to transport frames over a G.709 compliant network. UFEC module 24 may have system and/or line interfaces equipped with a G.709 compliant FEC codec (RS-255,239) and/or SFI-4 compliant interfaces.

EFEC module 26 may comprise any suitable processor, for example, the RUBICON (S19227) provided by APPLIED MICRO CIRCUITS CORPORATION. In certain embodiments, EFEC module 26 may provide Enhanced gain Forward Error Correction (EFEC) with ODU-2. EFEC module 26 may perform other suitable operations, such as ingress and egress client performance monitoring, client and line loop back functions, LAN transport through an OTN network, and/or G.709 ODU-2 synchronous and asynchronous mapping with G.709 overhead processing.

In certain embodiments, clocking system 30 includes discrete phase lock loops (PLLs) and programmable clock synthesizers that generate the desired frequencies and clock traceabilities. The phase lock loops may include one or more system PLLs SYS-PLLs 42a and 42b and one or more asynchronous PLLs ASYNC-PLLs 42c. System PLLs 42a and 42b reference a backplane clock to create a system traceable reference clock sys-60m for use by the data path clock synthesizers of system 38. Reference clock may have any suitable reference clock frequency. In the illustrated example, the reference clock frequency is 60.75 MHz. Asynchronous PLL 42c creates a smooth clock async-60m traceable to a client signal extracted from the network side. The asynchronous PLL can be configured to lock to reference/feedback signals from modules 24 or 26.

The clock synthesizers may include a network line clock synthesizer CSYN-NL 44a, a client line clock synthesizer CSYN-CL 44*b*, traceable reference clock synthesizers CSYN-DP1 46*a* and CSYN-DP4 46*b*, output clock synthesizers CSYN-DP2 48*a*, DP3 48*b*, DP5 48*c*, and DP6 48*d*.

Network line clock synthesizer 44*a* translates a recovered clock from network interface 20 to the reference clock frequency to yield reference n1-60*m* that serves as an available reference for other clock synthesizers (for example, DP2, DP3, DP5, DP6) that may be slave to the network line. Client line clock synthesizer 44*b* translates a recovered clock from client interface 36 to the reference clock frequency to yield reference c1-60*m* that serves as an available reference for other clock synthesizers that may be slave to the client line. Different programming files may be loaded into the synthesizers to account for different recovered clock frequencies. The programming files may be loaded based on application/port mode.

Traceable reference clock synthesizers CSYN-DP1 46*a* and CSYN-DP4 46*b* multiply the reference clock to yield system traceable references. The references may be used by the CDR operations of network interface 20 and client interface 36, respectively. Different programming files may be loaded into the synthesizers to account for different reference clock frequencies of the network and client ports. The programming files may be loaded based on application.

Reference selectors 47 (47*a*, . . . , 47*d*) select a reference, and may comprise software that enables the hardware to switch references. References may be switched in any suitable situation, for example, in response to detecting defects. Output clock synthesizers CSYN-DP2 48*a*, DP3 48*b*, DP5 48*c*, and DP6 48*d* generate the output clocks for the client side of module 24, client side of module 26, network side of module 26, and network side of module 24, respectively. Each synthesizer can be independently configured by software to reference any suitable reference, such as sys-60*m*, n1-60*m*, n1-60M, or async-60*m*. In certain embodiments, a selector 50 selects either network or client reference clocks as reference clock.

In certain embodiments, controller 40 configures the clocking system 38 according to several factors, which may include client and network rates, mapping/application mode, FEC support, presence of provisioned loop backs, port TCLK timing provisioning (Thru, System, Loop), or other suitable factor.

Controller 40 may perform any suitable operation for configured clocking system 38. Controller 40 may download configuration files. For example, controller 40 may download configuration files for clock synthesizers (CSYN-NL, CSYN-CL, CSYN-DP1 thru DP6) to produce the desired clock frequencies. In addition, controller 40 may select reference clocks and/or reference clock sources. For example, controller 40 may select the reference clock CSYN-DP2, DP3, DP5, or DP6 to attain appropriate timing traceability or may select modules 24 or 26 as the reference/feedback clock sources for the Async-PLL. In addition, controller 40 may configure the auto reference switching (ARS) logic. For example, controller 40 may enable/disable the ARS for CSYN-DP2 DP3, DP5, or DP6, or select the ARS clock qualification criteria for switching away from the n1-60*m*, c1-60*m*, and async-60*m* references.

Figure 3:
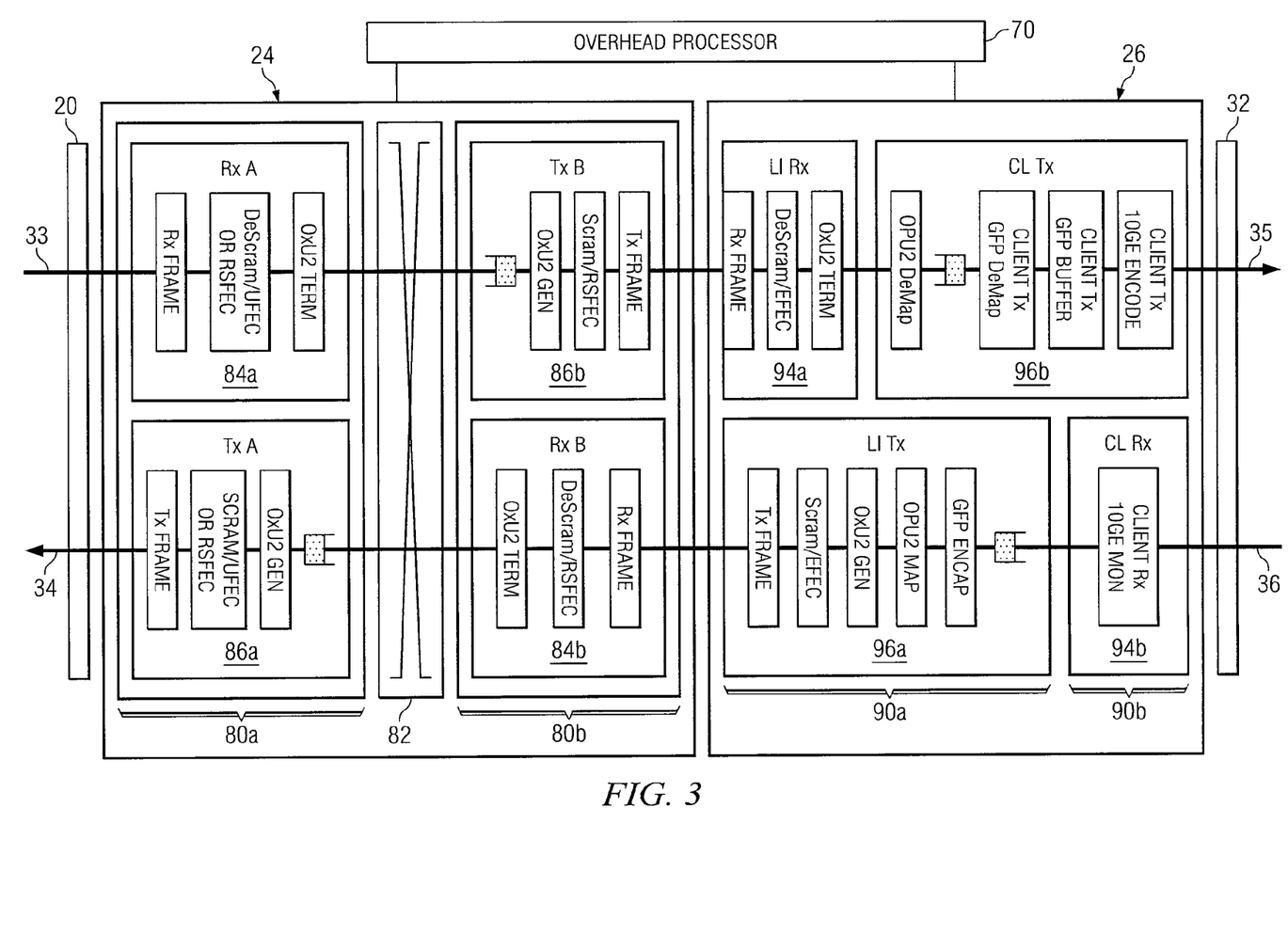
FIG. 3 illustrates examples of a UFEC module and an EFEC module that may be used with the system of FIG. 1.

FIG. 3 illustrates examples of UFEC module 24 and EFEC module 26 that may be used with system 10 of FIG. 1. In the illustrated embodiment, UFEC module 24 and EFEC module 26 are coupled to network interface 20, client interface 32, and an overhead processor 70 as shown.

In certain embodiments, UFEC module 24 includes a side A 80*a*, a cross connect 82, and a side B 80*b* coupled as shown. Side A 80*a* performs UFEC or RSFEC, and side B 80*b* performs RSFEC. Each side 80*a* and 80*b* includes a receive portion 84*a* and 84*b*, respectively, and a transmit portion 86*a* and 86*b*, respectively. Receive portion 84*a* or 84*b* performs operations (such as FEC operations) for received packets, and transmit portion 86*a* or 86*b* performs operations (such as FEC operations) for packets to be transmitted.

In certain embodiments, EFEC module 26 includes a line side 90*a* and client side 90*b* coupled as shown. Line (LI) side 90*a* performs EFEC, and client (CL) side 90*b* performs RSFEC. Each side 90*a* and 90*b* includes a receive portion 94*a* and 94*b*, respectively, and a transmit portion 96*a* and 96*b*, respectively. Receive portion 94*a* or 94*b* performs operations (such as FEC operations) for received packets, and transmit portion 96*a* or 96*b* performs operations (such as FEC operations) for packets to be transmitted.

In certain embodiments, overhead processor 70 generates overhead bytes as appropriate for UFEC module 24 and EFEC module 26.

FIGS. 4 through 16 illustrate examples of methods for handling FEC schemes that may be used by system 10 of FIGS. 1 and 2 and modules 24 and 26 of FIG. 3. The methods describe a FEC scheme X (such as the input FEC scheme of a stream) and a FEC scheme Y (such as the output FEC scheme of the stream). The methods may be performed in a reverse order such that FEC scheme Y is the input FEC scheme and FEC scheme X is the output FEC scheme. In some cases, FEC scheme Y may be the same as FEC scheme X. In other cases, FEC scheme Y may be different from FEC scheme X. In both types of cases, FEC scheme X may be regarded as "converted to" FEC scheme Y. In the examples, "conversion between FEC scheme X and FEC scheme Y" may be expressed as "X $\leftrightarrow$Y."

The methods may be used for first signals (which may be received signals) of a signal type J and second signals (which may be transmitted signals) of a signal type K, which may the same as or different from type J. "Conversion between signal type J and signal type K" may be expressed as "J$\leftrightarrow$K."

In certain embodiments, controller 40 receives information about detected defects and/or received overhead from module 24 or 26 that processes the stream.

FIGS. 4 through 7 illustrate examples of methods that may be used for unidirectional 3R regeneration. In the examples, a stream enters from the network side, FEC is performed, and the stream exits back to the network side.

Figure 4:
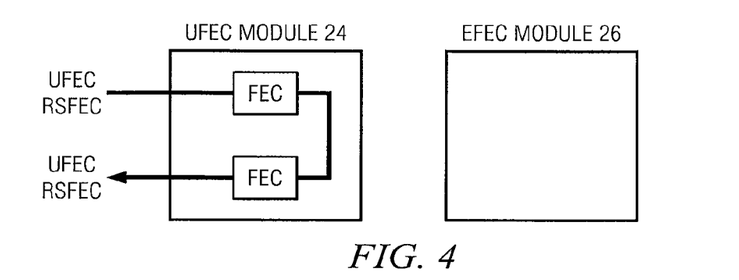
FIGS. 4 through 7 illustrate examples of methods that may be used for unidirectional 3R regeneration.

FIG. 4 illustrates an example of a method in which FEC scheme X is UFEC or RSFEC and FEC scheme Y is UFEC or RSFEC, yielding UFEC$\leftrightarrow$UFEC, RSFEC$\leftrightarrow$RSFEC, UFEC$\leftrightarrow$RSFEC, or RSFEC$\leftrightarrow$UFEC. In the example, side A 80*a* of UFEC module 24 performs the operations. The stream travels through side A receive portion 84*a*, cross connect 82, and side A transmit portion 86*a*. At side A transmit portion 86*a*, overhead processor 70 generates overhead bytes associated with the Session Management (SM) layer and any Tandem Connection Monitoring (TCM) layers provisioned for termination. Overhead bytes associated with unterminated TCM layers and the Performance Management (PM) layer pass through unmodified. FEC (RSFEC or UFEC) is performed, and the stream is transmitted to network interface 20.

Figure 5:
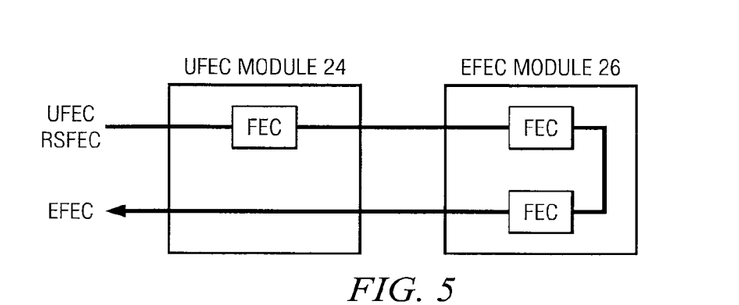

FIG. 5 illustrates an example of a method in which FEC scheme X is UFEC or RSFEC and FEC scheme Y is EFEC, yielding UFEC$\leftrightarrow$EFEC or RSFEC$\leftrightarrow$EFEC. In the example, side A receive portion 84*a* of UFEC module 24 performs receive processing, and side B 80*b* of UFEC module 24 generates the forward overhead bytes and RSFEC parity. EFEC module 26 hairpins the stream, aligns the stream to the incoming Frame Alignment Signal (FAS), and reencodes the stream to EFEC format. The stream is then transmitted back through UFEC module 24 to network interface 20.

Figure 6:
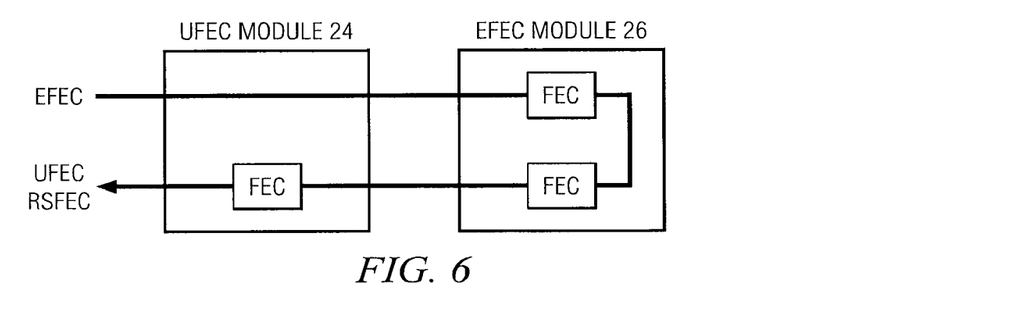

FIG. 6 illustrates an example of a method in which FEC scheme X is EFEC and FEC scheme Y is UFEC or RSFEC, yielding EFEC↔RSFEC or EFEC↔UFEC. In the example, UFEC module 24 is configured as a wire in path 33, which may allow EFEC module 26 to perform data alignment, overhead termination, and/or EFEC decoding and/or correction operations. The stream is hair pinned in EFEC module 26 using device internal loop backs.

The stream then enters egress processing in the LI side transmit portion 96a of EFEC module 26. Overhead bytes associated with the SM layer and any TCM layers provisioned for termination are generated. Overhead bytes associated with unterminated TCM layers and the PM layer pass through unmodified. The stream is then RSFEC encoded and passed to UFEC module 24. UFEC module 24 is configured to slave to the alignment of the stream and to regenerate the FEC parity bytes either using UFEC or RSFEC prior to sending the stream.

Figure 7:
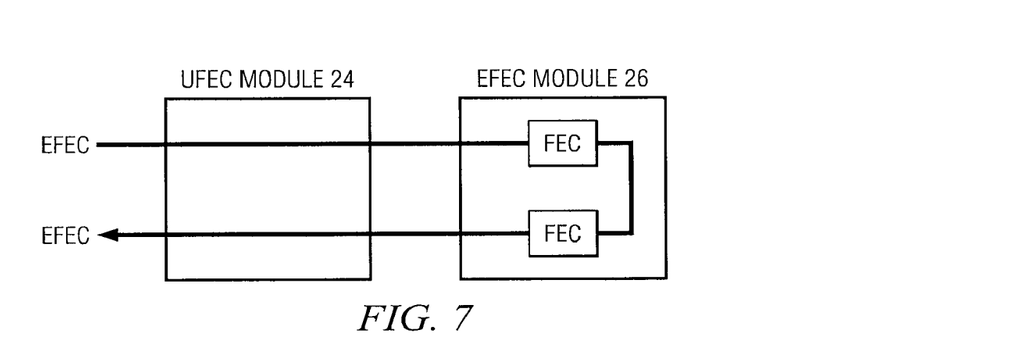

FIG. 7 illustrates an example of a method in which FEC scheme X is EFEC and FEC scheme Y is EFEC, such as EFEC↔EFEC. In the example, the network receive path may be similar to that for the EFEC↔RS or UFEC method. For transmission to network interface 20, EFEC module 26 is configured to generate EFEC parity, and UFEC module 24 for path 34 is configured as a wire to transparently pass the output stream to network interface 20 without modification.

Figure 8:
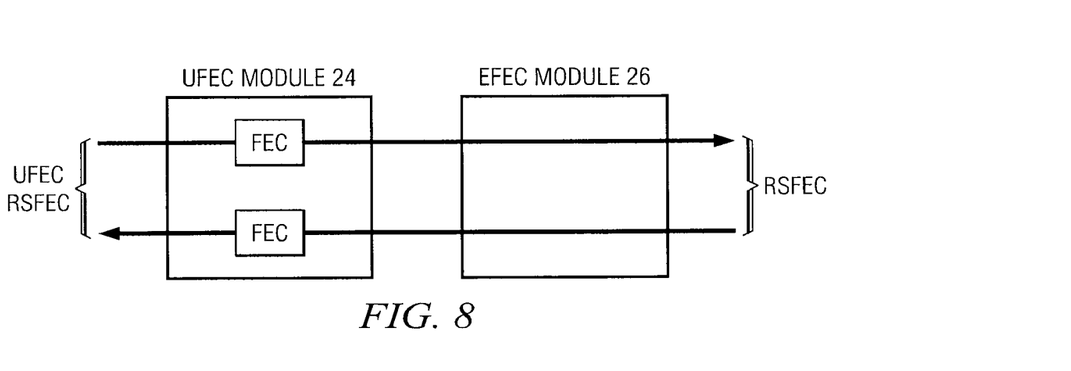
FIGS. 8 through 10 illustrate examples of methods that may be used for Optical channel Transport Unit (OTU) conversion.
Figure 9:
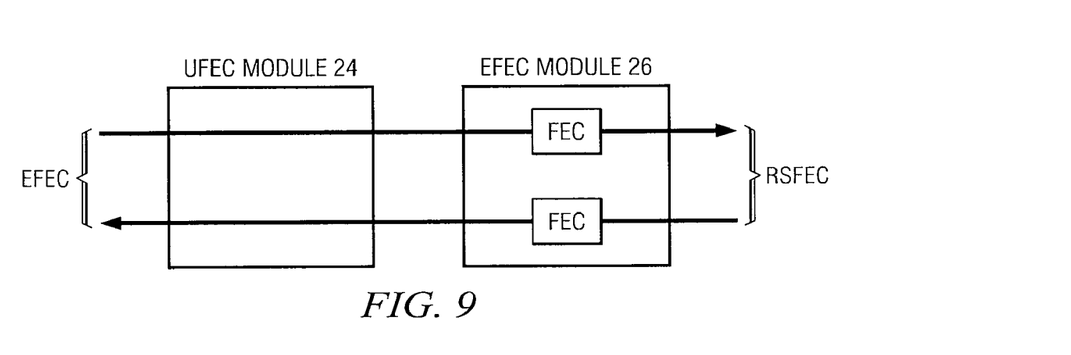
Figure 10:
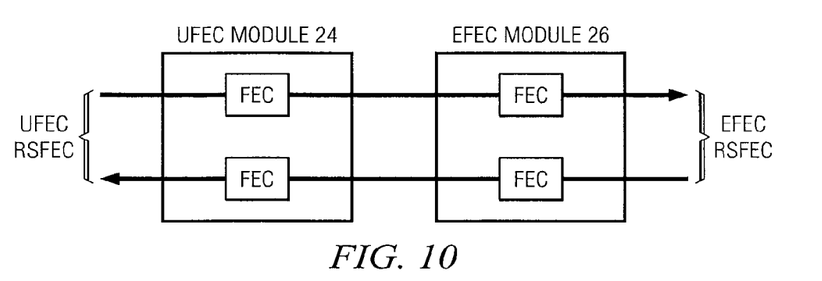

FIGS. 8 through 10 illustrate examples of methods that may be used for Optical channel Transport Unit (OTU) conversion, that is, OTU↔OTU, where OTU may be any suitable rate, such as OTU1, OTU2, or OTU3. In the examples, a stream enters from the network side, FEC is performed, and the stream exits to the client side, or vice-versa. In certain embodiments, SM layer termination may be implemented, and layers of TCM may be provisioned for termination or as transparent pass-through. Overhead processing, including backward and forward defect generation, may be supported for terminated layers.

FIG. 8 illustrates an example of a method in which FEC scheme X is UFEC or RSFEC and FEC scheme Y is RSFEC, yielding UFEC↔RSFEC or RSFEC↔RSFEC. In the example, UFEC module 24 handles termination on client and network ports. EFEC module 26 is configured as a bidirectional wire.

FIG. 9 illustrates an example of a method in which FEC scheme X is EFEC and FEC scheme Y is RSFEC, yielding EFEC↔RSFEC. In the example, the network side stream may be terminated and/or generated in EFEC module 26. UFEC module 24 is configured as a bidirectional wire.

FIG. 10 illustrates an example of a method in which FEC scheme X is UFEC or RSFEC and FEC scheme Y is EFEC or RSFEC, yielding UFEC↔RSFEC, RSFEC↔RSFEC, UFEC↔EFEC, or RSFEC↔EFEC. In the example, the network side stream may be terminated and/or generated in UFEC module 24 and/or EFEC module 26.

Figure 11:
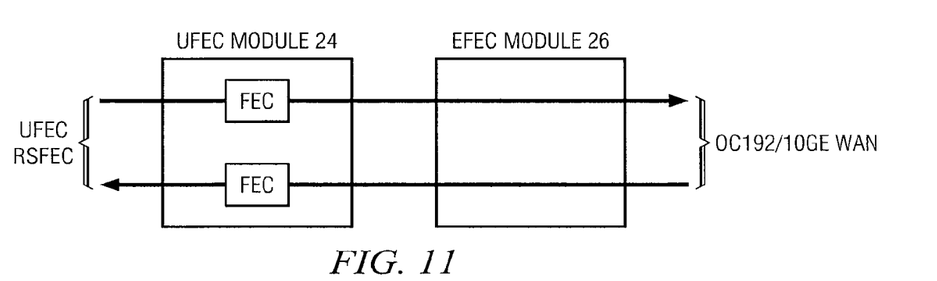
FIGS. 11 and 12 illustrate examples of methods that may be used for conversion between OTU Optical Carrier 192 (OC192)/10 Gigabit Ethernet-wide area network (10GE-WAN) signals.
Figure 12:
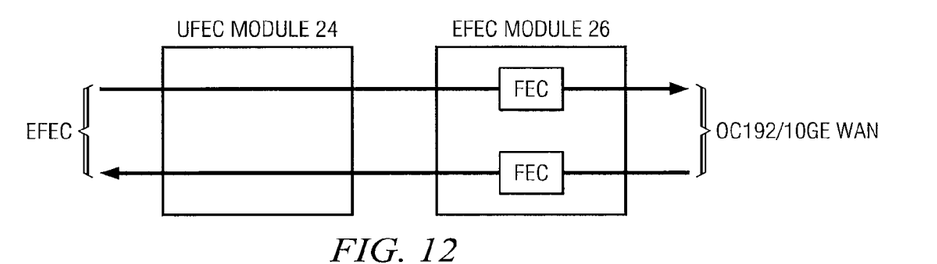

FIGS. 11 and 12 illustrate examples of methods that may be used for conversion between OTU Optical Carrier 192 (OC192)/10 Gigabit Ethernet-wide area network (10GE-WAN) signals, that is, OTU↔OC192/10GE-WAN. In certain embodiments, an OC192/10GE-WAN client side signal may be transported over a 10.709G OTU network side port. Overhead termination may be supported for SM, PM, and TCM levels. Overhead processing may include processing of forward and/or backward defects.

FIG. 11 illustrates an example of a method in which FEC scheme X is UFEC, RSFEC, or no FEC (NO-FEC) In the example, UFEC module 24 handles OTU termination on the network port. For a stream received from network interface 20, UFEC module 24 demaps the stream and operates in an asynchronous mode. UFEC module 24 provides reference and feedback clocks to controller 40 for use as inputs to the phase comparison logic for the asynchronous PLL (ASYNC-PLL). The demapped signal and its recovered timing may be passed to EFEC module 26 for transport overhead (TOH) processing and/or performance management and then sent to client interface 32.

For a stream received from client interface 32, the processing is reversed. UFEC module 24 may be configured for asynchronous or synchronous mapping. UFEC module 24 may configured to insert events into the stream for asynchronous mapping, but not for synchronous mapping.

FIG. 12 illustrates an example of a method in which FEC scheme X is EFEC. In the example, UFEC module 24 is configured as a bidirectional wire. EFEC module 26 provides OxU2 support.

Figure 13:
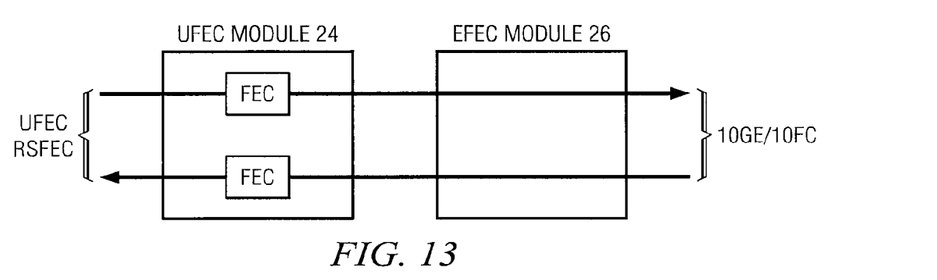
FIGS. 13 and 14 illustrate examples of methods that may be used for conversion between OTU Optical Carrier 192 (OC192) and 10 Gigabit Ethernet/10 Gigabit Fiber Channel (10GFC) Overclocked.
Figure 14:
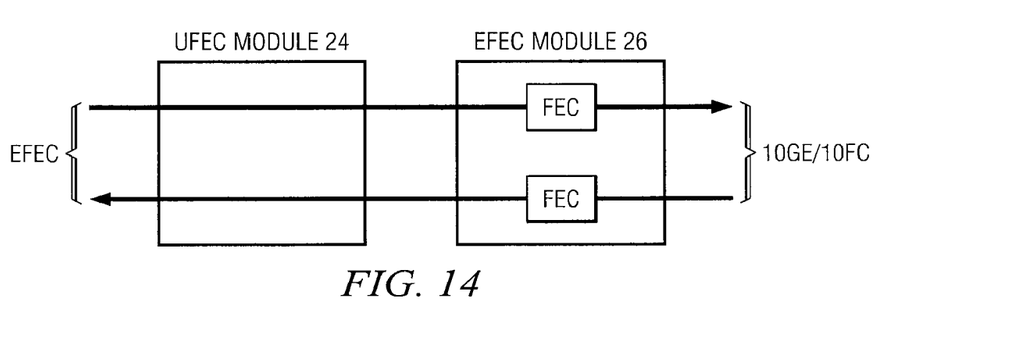

FIGS. 13 and 14 illustrate examples of methods that may be used for conversion between OTU Optical Carrier 192 (OC192) and 10 Gigabit Ethernet/10 Gigabit Fiber Channel (10GFC) Overclocked, that is, OTU ↔10GE/10GFC Overclocked.

FIG. 13 illustrates an example of a method in which FEC scheme X is UFEC, RSFEC, or NO-FEC. In the example, UFEC module 24 may be similar to that of the OTU↔OTU application, except that UFEC module 24 may source the Optical Channel Data unit (ODU) 2 overhead toward the network and/or client ports.

Optical Channel Payload unit (OPU) 2 of the stream from network interface 20 and its associated overhead passes through UFEC module 24 to/from EFEC module 26 over the interchip OTU. This may allow EFEC module 26 to perform the bit synchronous mapping/demapping. The OPU2 from EFEC module 26 is passed through UFEC module 24. UFEC module 24 may overwrite the path trace identifier (PTI).

FIG. 14 illustrates an example of a method in which FEC scheme X is EFEC. In the example, UFEC module 24 is configured as a bidirectional wire, and EFEC module 26 terminates the network side OxU2.

Figure 15:
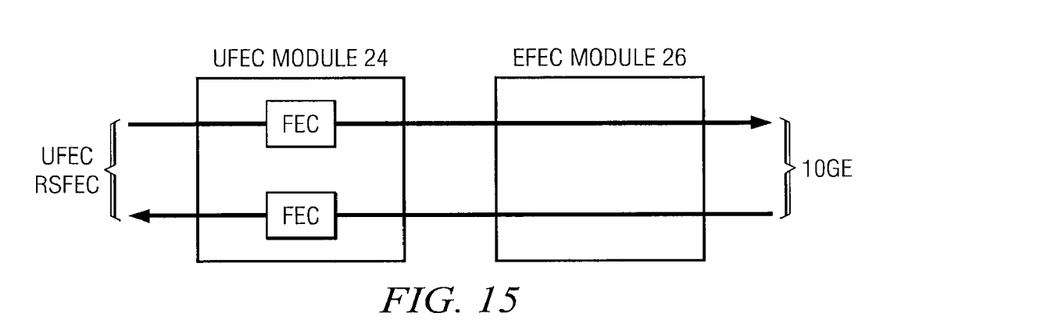
FIGS. 15 and 16 illustrate examples of methods that may be used for conversion between OTU and Optical Carrier 192 (OC192) 10 Gigabit Ethernet Generic Framing Procedure-Frame Mode (GFP-F)/GFP-Semi-Transparent (GFP-ST).
Figure 16:
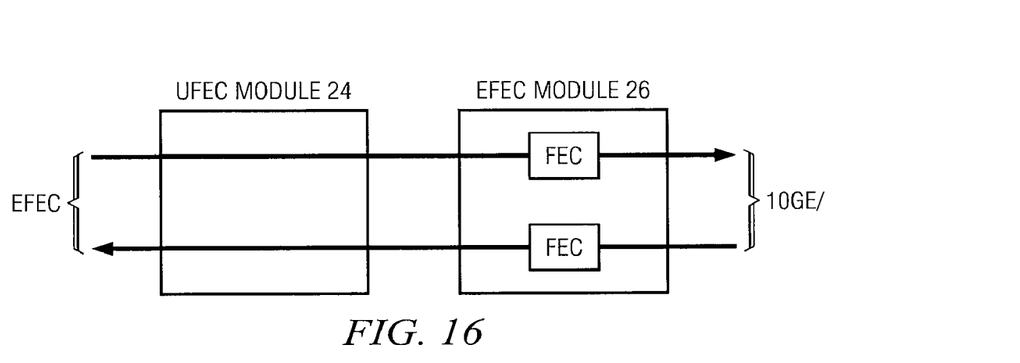

FIGS. 15 and 16 illustrate examples of methods that may be used for conversion between OTU and Optical Carrier 192 (OC192) 10 Gigabit Ethernet Generic Framing Procedure-Frame Mode (GFP-F)/GFP-Semi-Transparent (GFP-ST), that is, OTU ↔10GE GFP-F/GFP-ST.

FIG. 15 illustrates an example of a method in which FEC scheme X is UFEC, RSFEC, or NO-FEC. In the example, UFEC module 24 may be similar to that of the OTU↔OTU application, except that UFEC module 24 may source ODU overhead toward the network and/or client ports. OPU of the stream from network interface 20 and the associated overhead passes through UFEC module 24 to/from EFEC module 26 over the interchip OTU, allowing EFEC module 26 to perform the bit synchronous mapping/demapping. The OPU2 from EFEC module 26 is passed through UFEC module 24. UFEC module 24 may overwrite the path trace identifier (PTI).

FIG. 16 illustrates an example of a method in which FEC scheme X is EFEC. UFEC module 24 is configured as a bidirectional wire, and EFEC module 26 terminates the network side OxU2.

Modifications, additions, or omissions may be made to the systems disclosed herein without departing from the scope of the invention. The components of the systems may be integrated or separated. Moreover, the operations of the systems may be performed by more, fewer, or other components.

Additionally, operations of the systems may be performed using any suitable logic comprising software, hardware, and/or other logic. As used in this document, "each" refers to each member of a set or each member of a subset of a set.

Modifications, additions, or omissions may be made to the methods disclosed herein without departing from the scope of the invention. The methods may include more, fewer, or other steps. Additionally, steps may be performed in any suitable order.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the following claims.

What is claimed is:

1. A system comprising:
   a substrate;
   a plurality of forward error correction (FEC) modules disposed outwardly from the substrate, the plurality of FEC modules comprising:
      a first FEC module configured to perform forward error correction according to a first FEC scheme; and
      a second FEC module configured to perform forward error correction according to a second FEC scheme; and
   a controller configured to:
      configure the first FEC module and the second FEC module to convert from an input FEC scheme to an output FEC scheme for a stream by identifying that the input FEC scheme is the first FEC scheme, identifying that the output FEC scheme is the second FEC scheme, and configuring the first FEC module and the second FEC module to convert from the first FEC scheme to the second FEC scheme.

2. The system of claim 1:
   the first FEC scheme comprising Ultra FEC; and
   the second FEC scheme comprising Enhanced FEC.

3. The system of claim 1:
   the first FEC module configured to perform forward error correction according to a common FEC scheme; and
   the second FEC module configured to perform forward error correction according to the common FEC scheme.

4. The system of claim 1, the controller configured to configure the first FEC module and the second FEC module by:
   identifying that the input FEC scheme is the first FEC scheme;
   identifying that the output FEC scheme is the first FEC scheme; and
   configuring the first FEC module to perform forward error correction according to the first FEC scheme.

5. The system of claim 1, the controller configured to configure the first FEC module and the second FEC module by:
   identifying that the input FEC scheme is the second FEC scheme;
   identifying that the output FEC scheme is the second FEC scheme; and
   configuring the second FEC module to perform forward error correction according to the second FEC scheme.

6. The system of claim 1, the controller configured to:
   identify an input signal type of a stream and an output signal type of the stream; and
   configure a clocking system to convert from the input signal type to the output signal type.

7. The system of claim 1, further comprising a plurality of clock synthesizers, each clock synthesizer configured to translate a recovered clock to a reference clock for one or more of the plurality of FEC modules.

8. The system of claim 1, further comprising a clock selector configured to select a reference clock for one or more of the plurality of FEC modules.

9. The system of claim 1, further comprising an overhead processor configured to:
   generate a frame overhead for the stream.

10. A method comprising:
    performing, by a first forward error correction (FEC) module of a plurality of FEC modules, forward error correction according to a first FEC scheme;
    performing, by a second FEC module of the plurality of FEC modules, forward error correction according to a second FEC scheme, the FEC modules disposed outwardly from a substrate; and
    configuring, by a controller, the first FEC module and the second FEC module to convert from an input FEC scheme to an output FEC scheme for a stream by identifying that the input FEC scheme is the first FEC scheme, identifying that the output FEC scheme is the second FEC scheme, and configuring the first FEC module and the second FEC module to convert from the first FEC scheme to the second FEC scheme.

11. The method of claim 10:
    the first FEC scheme comprising Ultra FEC; and
    the second FEC scheme comprising Enhanced FEC.

12. The method of claim 10:
    performing, by the first FEC module, forward error correction according to a common FEC scheme; and
    performing, by the second FEC module, forward error correction according to the common FEC scheme.

13. The method of claim 10, the configuring the first FEC module and the second FEC module further comprising:
    identifying that the input FEC scheme is the first FEC scheme;
    identifying that the output FEC scheme is the first FEC scheme; and
    configuring the first FEC module to perform forward error correction according to the first FEC scheme.

14. The method of claim 10, the configuring the first FEC module and the second FEC module further comprising:
    identifying that the input FEC scheme is the second FEC scheme;
    identifying that the output FEC scheme is the second FEC scheme; and
    configuring the second FEC module to perform forward error correction according to the second FEC scheme.

15. The method of claim 10, further comprising:
    identifying an input signal type of a stream and an output signal type of the stream; and
    configuring a clocking system to convert from the input signal type to the output signal type.

16. The method of claim 10, further comprising:
    translating a recovered clock to a reference clock for one or more of the plurality of FEC modules.

17. The method of claim 10, further comprising:
    selecting a reference clock for one or more of the plurality of FEC modules.

18. The method of claim 10, further comprising:
    generating, by an overhead processor, a frame overhead for the stream.

* * * * *